United States Patent
Lu et al.

(10) Patent No.: US 11,353,938 B2
(45) Date of Patent: Jun. 7, 2022

(54) INSTALLATION DEVICE AND SERVER INCLUDING INSTALLATION DEVICE

(71) Applicants: Inventec (Pudong) Technology Corporation, Shanghai (CN); INVENTEC CORPORATION, Taipei (TW)

(72) Inventors: Xiaogang Lu, Shanghai (CN); Qi Liu, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/029,066

(22) Filed: Sep. 23, 2020

(65) Prior Publication Data
US 2022/0066520 A1    Mar. 3, 2022

(30) Foreign Application Priority Data

Aug. 27, 2020 (CN) .......................... 202010879295.X

(51) Int. Cl.
*G06F 1/18* (2006.01)
*H05K 7/14* (2006.01)

(52) U.S. Cl.
CPC ........... *G06F 1/187* (2013.01); *H05K 7/1489* (2013.01)

(58) Field of Classification Search
CPC ....................................................... G06F 1/187
See application file for complete search history.

(56) References Cited

U.S. PATENT DOCUMENTS

| | | | | |
|---|---|---|---|---|
| 5,510,955 A * | 4/1996 | Taesang | ............... | H05K 7/1411 361/679.31 |
| 5,682,291 A * | 10/1997 | Jeffries | .................... | G06F 1/184 312/223.2 |
| 5,921,644 A * | 7/1999 | Brunel | ................. | G11B 33/124 312/223.2 |
| 6,885,551 B2 * | 4/2005 | Chen | ....................... | G06F 1/184 312/223.1 |
| 7,495,904 B2 * | 2/2009 | Liang | ...................... | G06F 1/187 361/679.39 |
| 7,515,410 B1 * | 4/2009 | Dingfelder | .............. | G06F 1/187 361/679.33 |
| 7,630,197 B2 * | 12/2009 | Chen | .................... | G11B 33/124 312/223.1 |

(Continued)

*Primary Examiner* — Adrian S Wilson

(57) ABSTRACT

The present disclosure provides an installation device and a server including the installation device. The installation device includes: a bottom bracket for supporting a hard disk drive; a first positioning bracket detachably arranged on a first side of the bottom bracket; and a second positioning bracket fixedly arranged on a second side opposite to the first side of the bottom bracket; the first positioning bracket and the second positioning bracket are configured to fix the hard disk drive. Compared with the traditional design, four screws are omitted in the present disclosure to avoid manual locking operation in the production line and operation and maintenance of the hard disk drive module, which meets the requirements of easy installation and cost-saving design. And by adding an adapter bracket, it can be converted to a 2.5-inch hard drive bracket, which has strong compatibility.

13 Claims, 4 Drawing Sheets

(56) References Cited

U.S. PATENT DOCUMENTS

| | | | | |
|---|---|---|---|---|
| 7,701,707 | B2* | 4/2010 | Peng | G11B 33/128 361/679.37 |
| 7,903,401 | B2* | 3/2011 | Lee | G06F 1/187 361/679.33 |
| 8,154,862 | B2* | 4/2012 | Lai | G11B 33/122 361/679.33 |
| 8,448,791 | B2* | 5/2013 | Zhang | G06F 1/188 211/26 |
| 9,122,459 | B2* | 9/2015 | Peng | G11B 33/124 |
| 9,389,653 | B2* | 7/2016 | Wang | G06F 1/182 |
| 10,470,330 | B1* | 11/2019 | Chen | G11B 33/025 |
| 10,732,680 | B1* | 8/2020 | Lu | G11B 33/1406 |
| 2006/0130082 | A1* | 6/2006 | Chen | G11B 33/122 720/649 |
| 2009/0103252 | A1* | 4/2009 | Peng | G11B 33/124 361/679.4 |
| 2009/0129009 | A1* | 5/2009 | Zhang | G11B 33/121 361/679.34 |
| 2010/0187957 | A1* | 7/2010 | Liang | G06F 1/187 312/223.2 |
| 2012/0050978 | A1* | 3/2012 | Lai | G11B 33/122 361/679.33 |

* cited by examiner

INSTALLATION DEVICE AND SERVER INCLUDING INSTALLATION DEVICE

CROSS REFERENCE TO RELATED APPLICATION

The present application is related to and claims the benefit of priority to Chinese Patent Application No. 202010879295X, filed on 27 Aug. 2020, the contents of which are incorporated herein by reference in its entirety.

BACKGROUND

Field of Disclosure

The present disclosure belongs to the technical field of chassis hardware, and relates to a device, in particular to an installation device and a server including the installation device.

Description of Related Arts

With the development of information technology, the demand for data storage has increased, resulting in an increasing number of hard disk storage devices, and more demand for pull-out hard disk applications.

The pull-out hard disk allows users to have more choices when using hard disk storage, which can be easily assembled and disassembled, and the number and capacity of hard disks can be adjusted as needed. It is convenient for staff to take the hard disk for data backup and recovery in the fields of video capture and data collection.

The connection between the existing pull-out hard disk and the motherboard needs to be realized through a hard disk drawer and an adapter electronic backplane. The electronic backplane needs a chassis designed on the basis of the existing standard pull-out hard disk box, and its versatility is poor. When customer needs, chassis structure, and product features change, it is necessary to design a corresponding pull-out hard disk system, which will increase the cost.

Therefore, how to provide an installation device and a server including the installation device to solve the disadvantages of poor versatility of the prior art and inability to meet the needs of customers for different application scenarios has become a technical problem to be solved by those skilled in the art.

SUMMARY OF THE PRESENT DISCLOSURE

The present disclosure provides an installation device and a server including the installation device, to solve the problems of poor versatility of the prior art and inability to meet the needs of customers for different application scenarios.

The present disclosure provides an installation device for installing a hard disk drive. The installation device includes: a bottom bracket for supporting the hard disk drive; a first positioning bracket detachably arranged on a first side of the bottom bracket; and a second positioning bracket fixedly arranged on a second side opposite to the first side of the bottom bracket; the first positioning bracket and the second positioning bracket are configured to fix the hard disk drive.

In an embodiment of the present disclosure, the first positioning bracket and the second positioning bracket includes a positioning member; the positioning member corresponds to a side hole on a side of the hard disk drive; and a first side and a second side of the bottom bracket are parallel to an installation direction of the hard disk drive.

In an embodiment of the present disclosure, the positioning member includes a first positioning member placed on the first positioning bracket, a second positioning member placed on the second positioning bracket, and a third positioning member placed on the first side of the bottom bracket; a first side surface of the hard disk drive includes a first side hole, the first side hole corresponds to the first positioning member, a second side surface opposite to the first side surface of the hard disk drive includes a second side hole, and the second side hole corresponds to the second positioning member; a bottom side of the hard disk drive includes a third side hole, and the third side hole corresponds to the third positioning member.

In an embodiment of the present disclosure, the first positioning bracket includes a first fixing surface and a second fixing surface, the first fixing surface is perpendicular to the second fixing surface, and the first positioning member is placed on the first fixing surface.

In an embodiment of the present disclosure, the hard disk drive includes a first hard disk drive and a second hard disk drive, and a size of the first hard disk drive is larger than a size of the second hard disk drive.

In an embodiment of the present disclosure, the first side of the bottom bracket includes a notch groove.

In an embodiment of the present disclosure, when the hard disk drive is the first hard disk drive and the first hard disk drive is put into the bottom bracket, the second positioning member is buckled into a second side hole of the first hard disk drive, and the third positioning member is buckled into a third side hole of the first hard disk drive to fix the second positioning bracket and the bottom bracket to the first hard drive.

In an embodiment of the present disclosure, a pressing buckle is installed at a position of the first positioning bracket corresponding to the notch groove; when the first hard disk drive is put into the bottom bracket, the pressing buckle of the first positioning bracket is slided into the notch groove, and the second fixing surface of the first positioning bracket is located at a lower part of the first side of the bottom bracket to fix the first positioning bracket to the first hard disk drive.

In an embodiment of the present disclosure, when the hard disk drive is the first hard disk drive, a length of the first positioning bracket is not greater than a length of the first side of the bottom bracket; a length of the second positioning bracket is not greater than a length of the second side of the bottom bracket; and the first side of the bottom bracket is parallel to the second side.

In an embodiment of the present disclosure, when the hard disk drive is the second hard disk drive and the second hard disk drive is put into the bottom bracket, the second positioning member is buckled into a second side hole of the second hard disk drive to fix the second positioning bracket to the second hard drive.

In an embodiment of the present disclosure, when the second hard disk drive is put into the bottom bracket, the third positioning member of the bottom bracket is buckled into a third side hole in a bottom side of the first positioning bracket, and the first fixing surface of the first positioning bracket is fixed to the first side surface of the hard disk drive by a bolt, to fix the first positioning bracket and the bottom bracket to the second hard drive.

In an embodiment of the present disclosure, when the hard disk drive is the second hard disk drive, a length of the first positioning bracket is smaller than a length of the first side of the bottom bracket; a length of the second positioning bracket is not greater than a length of the second side of the bottom bracket.

In an embodiment of the present disclosure, the installation device further includes a rotary latch arranged on a bottom edge of the bottom bracket; the rotary latch includes: a stop part integrally formed with the bottom bracket; and a rotation part rotatably connected with the stop part.

The present disclosure further provides a server, including: the installation device and the hard disk drive fixed on the installation device; the hard disk drives are arranged in an array.

As described above, the installation device and the server including the installation device of the present disclosure have the following beneficial effects:

The present disclosure provides an installation device and a server including the installation device. Compared with the traditional design, four screws are omitted to avoid manual locking operation in the production line and operation and maintenance of the hard disk drive module, which meets the requirements of easy installation and cost-saving design. In the installation operation, it only needs to put into the hard disk drive module, slide the module into place, and press the pressing buckle to complete the installation, which greatly saves installation time during mass production. And by adding an adapter bracket, it can be converted to a 2.5-inch hard drive bracket, which has strong compatibility.

DESCRIPTION OF COMPONENT MARK NUMBERS

Figure 1A:
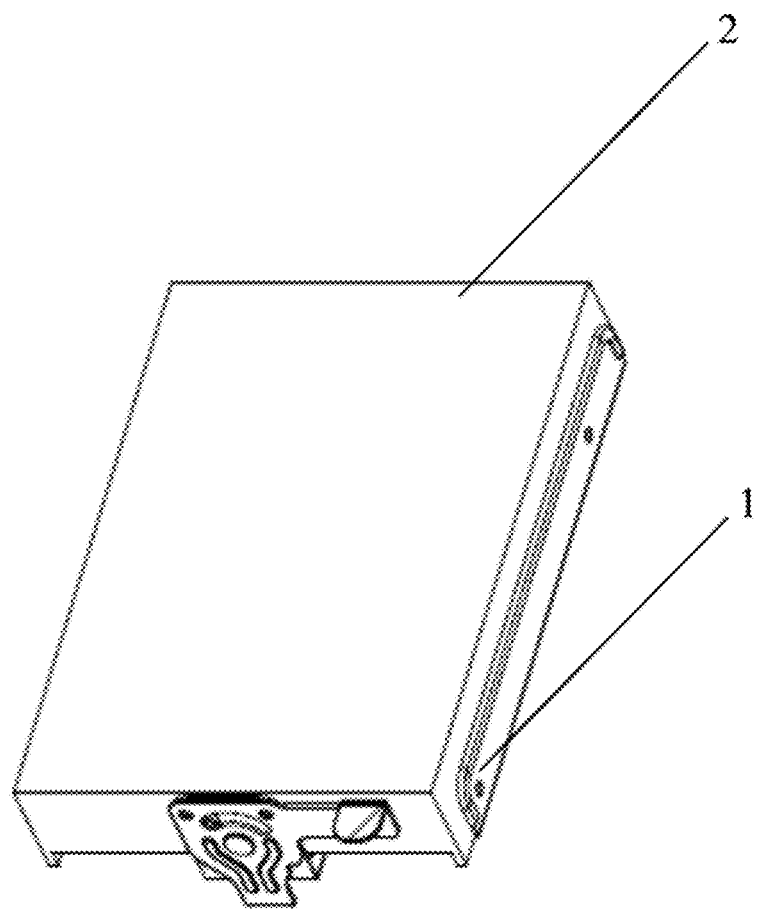
FIG. 1A shows a schematic perspective view of an installation device suitable for a first hard disk drive of the present disclosure.

1 Installation device
10 Bottom bracket
11 First positioning bracket
12 Second positioning bracket
13 Rotary latch
111 First positioning member
112 Pressing buckle
121 Second positioning member
101 Third positioning member
102 Notch groove
2 3.5-inch hard disk drive
21 Second side hole
3 Installation device
30 Bottom bracket
31 First positioning bracket
32 Second positioning bracket
311 First positioning member
321 Second positioning member
301 Third positioning member
4 2.5-inch hard disk drive
41 Second side hole

DETAILED DESCRIPTION OF THE PREFERRED EMBODIMENTS

The embodiments of the present disclosure will be described below. Those skilled may easily understand other advantages and effects of the present disclosure according to contents disclosed by the specification.

It should be understood that the structures, proportions, sizes, and the like, which are illustrated in the drawings of the present specification, are only used to clarify the contents disclosed in the specification for understanding and reading by those skilled, and are not intended to limit the implementation of the present disclosure, thus are not technically meaningful. Any modification of the structure, change of the scale, or adjustment of the size should still fall within the scope of the technical contents disclosed by the present disclosure without affecting the effects and achievable objectives of the present disclosure. In the meantime, the terms "upper", "lower", "left", "right", "intermediate" and "one" as used in this specification are also for convenience of description, and are not intended to limit the scope of the present disclosure, and the change or adjustment of the relative relationship is considered to be within the scope of the present disclosure without substantial changes in technology.

The present disclosure provides an installation device for installing a hard disk drive. the installation device includes: a bottom bracket for supporting the hard disk drive; a first positioning bracket detachably arranged on a first side of the bottom bracket; and a second positioning bracket fixedly arranged on a second side opposite to the first side of the bottom bracket; the first positioning bracket and the second positioning bracket are configured to fix the hard disk drive.

Figure 1B:
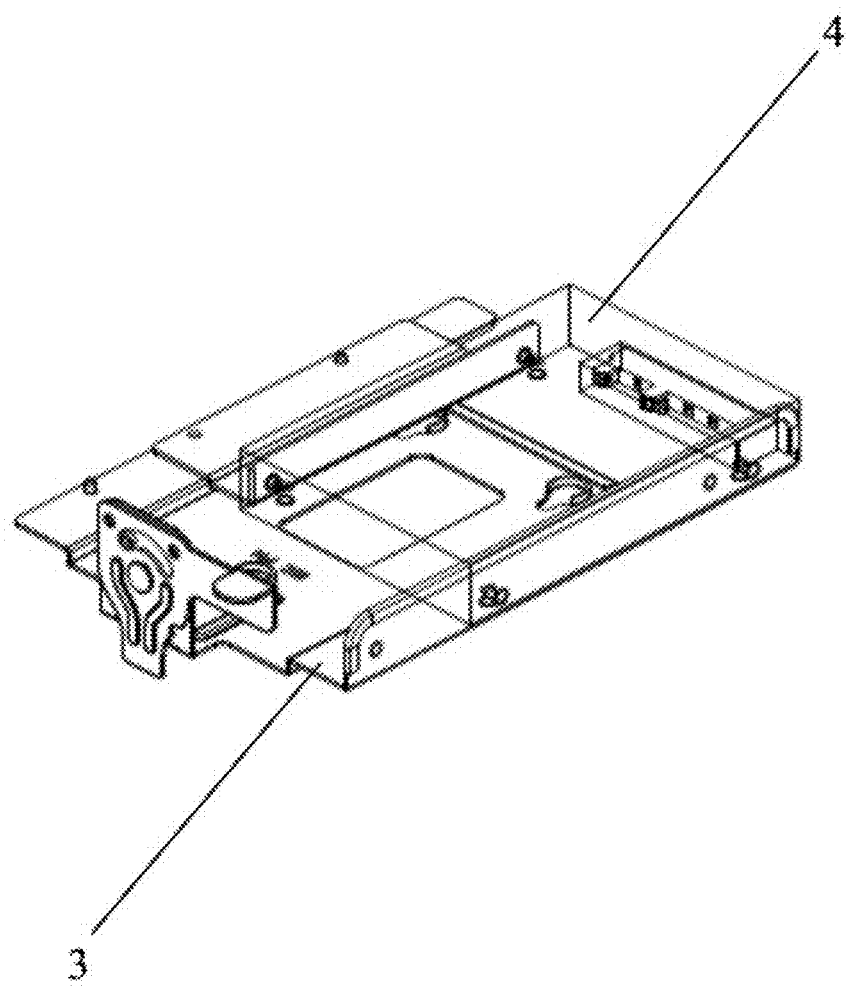
FIG. 1B shows a schematic perspective view of an installation device suitable for a second hard disk drive of the present disclosure.

The installation device in this embodiment will be described in detail below with reference to the drawings. FIG. 1A shows a schematic perspective view of an installation device suitable for a first hard disk drive. FIG. 1B shows a schematic perspective view of an installation device suitable for a second hard disk drive. The hard disk drive includes the first hard disk drive and the second hard disk drive, and the size of the first hard disk drive is larger than the size of the second hard disk drive.

In this embodiment, the first hard disk drive is a 3.5-inch hard disk drive. The second hard disk drive is a 2.5-inch hard disk drive.

As shown in FIG. 1A, the first hard disk drive 2 slides into the installation device 1, and the installation device 1 firmly holds the first hard disk drive 2. As shown in FIG. 1B, the second hard disk drive 4 slides into the installation device 3, and the installation device 3 firmly holds the first hard disk drive 4.

Embodiment 1

Figure 2:
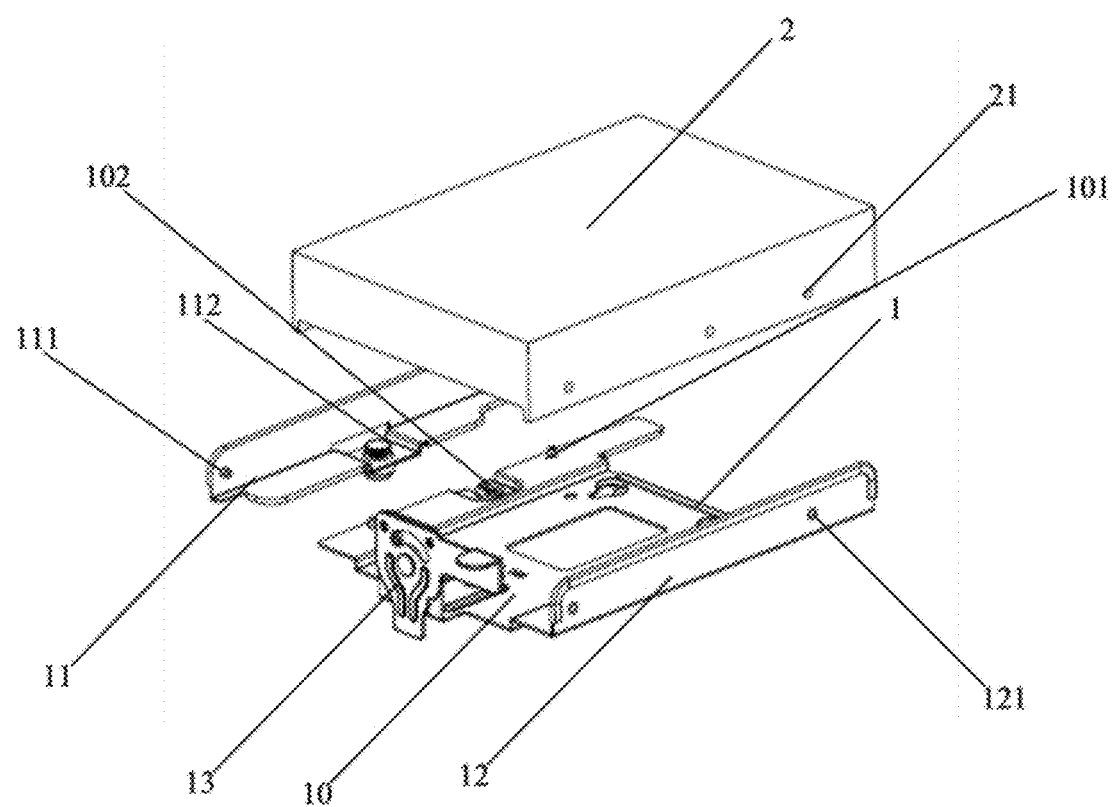
FIG. 2 shows an exploded view of a structure of the installation device of the present disclosure.

FIG. 2 shows an exploded view of an implementation structure of the installation device. As shown in FIG. 2, the installation device 1 for fixing the 3.5-inch hard disk drive 2 includes a bottom bracket 10, a first positioning bracket 11, a second positioning bracket 12, and a rotary latch 13. The length of the first positioning bracket 11 is not greater than the length of the first side of the bottom bracket 10, and the length of the second positioning bracket 12 is not greater than the length of the second side of the bottom bracket 10. The first side of the bottom bracket 10 is parallel to the second side.

To limit the position of the 3.5-inch hard disk drive 2 in the vertical and lateral directions on the installation device 1, the first positioning bracket 11 and the second positioning bracket 12 include a positioning member. The positioning member corresponds to a side hole on the side of the hard disk drive, and the first side and the second side of the bottom bracket 10 are parallel to the installation direction of the hard disk drive.

Specifically, the positioning member includes a first positioning member 111 placed on the first positioning bracket 11 (a first fixing surface of the first positioning bracket 11 is perpendicular to a second fixing surface arranged with the first positioning member 111), a second positioning member 121 placed on the second positioning bracket 12, and a third positioning member 101 placed on the first side of the bottom bracket 10. A first side surface of the 3.5-inch hard disk drive 2 includes a first side hole (not shown). The first side hole corresponds to the first positioning member 111. A second side surface opposite to the first side surface of the 3.5-inch hard disk drive 2 includes a second side hole 21, and the second side hole 21 corresponds to the second positioning member 121. A bottom side of the 3.5-inch hard disk drive 2 includes a third side hole, and the third side hole corresponds to the third positioning member. In practical applications, the first positioning member 111, the second positioning member 121, and the third positioning member 101 are positioning buckles.

To prevent the 3.5-inch hard disk drive 2 from falling when subjected to an external force, the second fixing surface of the first positioning bracket 11 includes a pressing buckle 112, the first side of the bottom bracket 10 includes a notch groove 102, and the setting position of the pressing buckle 112 corresponds to the setting position of the notch groove 102. When the 3.5-inch hard disk drive 2 is put into the bottom bracket 10, the pressing buckle 112 of the first positioning bracket 11 is slided into the notch groove 102, and the second fixing surface of the first positioning bracket 11 is inserted into the lower part of the first side of the bottom bracket 10 to fix the first positioning bracket 11 to the 3.5-inch hard disk drive 2. The second positioning member 121 is buckled into the second side hole of the 3.5-inch hard disk drive 2, and the third positioning member 101 is snapped into the third side hole of the first hard disk drive 2, to fix the second positioning bracket 12 and the bottom bracket 10 to the 3.5-inch hard disk drive 2.

To prevent the 3.5-inch hard disk drive 2 from sliding, a rotary latch 13 is arranged on a bottom edge of the bottom bracket 10. The rotary latch 13 includes a stop part and a rotation part. The stop part is integrally formed with the bottom bracket, and the rotation part is rotatably connected with the stop part.

The connection between the installation device and the 3.5-inch hard disk drive in this embodiment adopts no screw. Compared with the traditional design, four screws are omitted to avoid manual locking operation in the production line and operation and maintenance of the hard disk drive module, which meets the requirements of easy installation and cost-saving design. In the installation operation, it only needs to put into the module, slide the module into place, and press the pressing buckle to complete the installation. It only takes a few seconds to install a group of hard disk drives, which greatly saves installation time during mass production.

Embodiment 2

Figure 3:
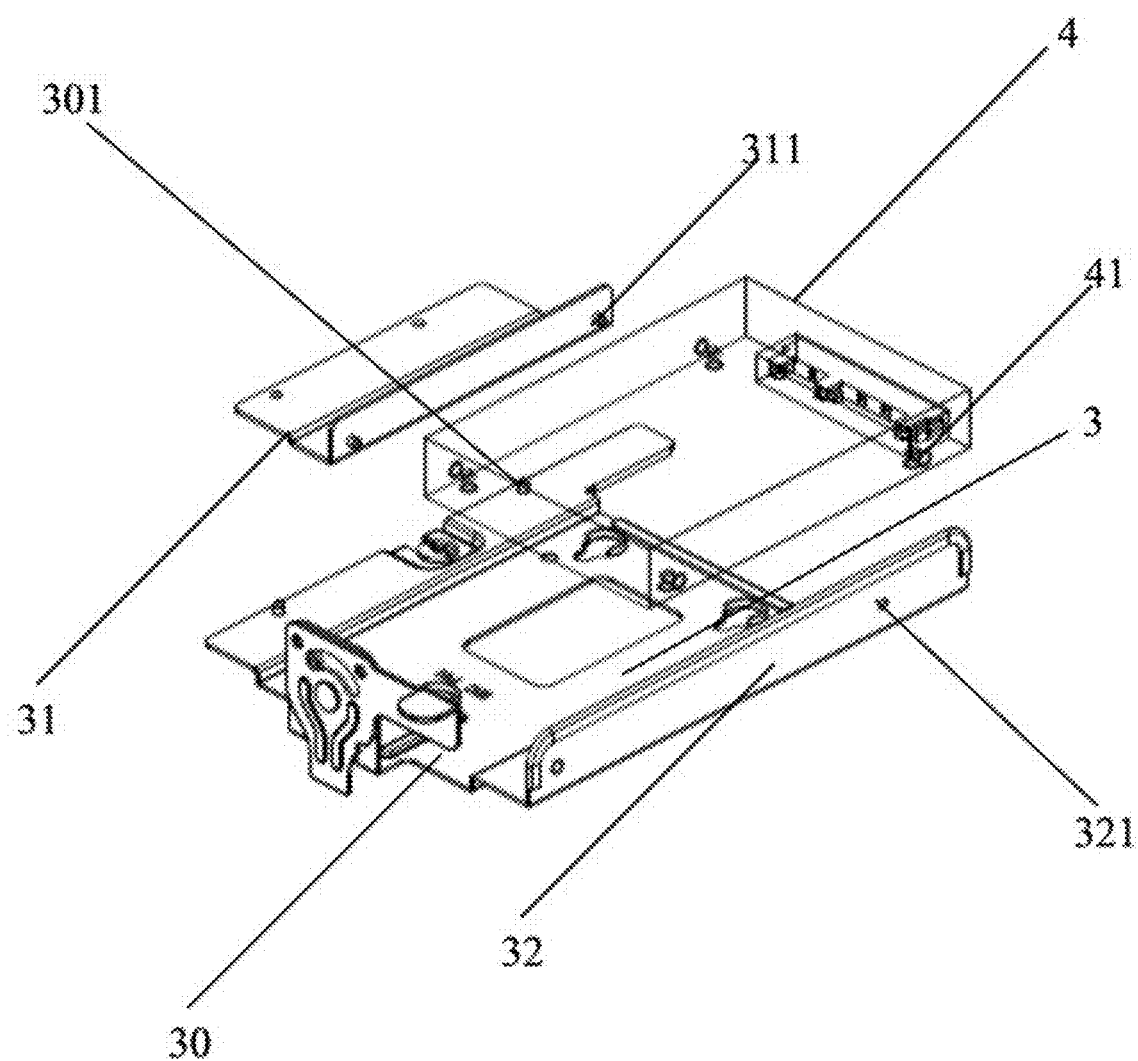
FIG. 3 shows an exploded view of another structure of the installation device of the present disclosure.

FIG. 3 shows an exploded view of another implementation structure of the installation device. As shown in FIG. 3, the installation device 3 for fixing the 2.5-inch hard disk drive 4 includes a bottom bracket 30, a first positioning bracket 31, and a second positioning bracket 32. The length of the first positioning bracket 31 is less than the length of the first side of the bottom bracket 30, and the length of the second positioning bracket 32 is not greater than the length of the second side of the bottom bracket 30.

To limit the position of the 2.5-inch hard disk drive 4 in the vertical and lateral directions on the installation device 3, the first positioning bracket 31 and the second positioning bracket 32 include a positioning member. The positioning member corresponds to a side hole on the side of the hard disk drive, and the first side and the second side of the bottom bracket 30 are parallel to the installation direction of the hard disk drive.

Specifically, the positioning member includes a first positioning member 311 placed on the first positioning bracket 31 (specifically, the first positioning member 311 is placed on a first fixing surface of the first positioning bracket 31, the first fixing surface is perpendicular to a second fixing surface), a second positioning member 321 placed on the second positioning bracket 32, and a third positioning member 301 placed on the first side of the bottom bracket 30. A first side surface of the 2.5-inch hard disk drive 4 includes a first side hole (not shown). The first side hole corresponds to the first positioning member 311. A second side surface opposite to the first side surface of the 2.5-inch hard disk drive 4 includes a second side hole 41, and the second side hole 41 corresponds to the second positioning member 321. The bottom side of the second fixing surface of the first positioning bracket 31 includes a third side hole (not shown), and the third side hole corresponds to the third positioning member 301. In practical applications, the first positioning member 311 adopts bolts, the second positioning member 321 and the third positioning member 301 adopt positioning buckles.

When the 2.5-inch hard disk drive 4 is put into the bottom bracket 30, the first fixing surface of the first positioning bracket 31 is fixed to the first side surface of the 2.5-inch hard disk drive 4 by bolts, and the positioning buckle 301 of the bottom bracket 30 is buckled into the third side hole in the bottom side of the first positioning bracket 31, to fix the first positioning bracket and the bottom bracket to the second hard disk drive. The positioning buckle 321 of the second positioning bracket 32 is buckled into the second side hole of the second side surface of the 2.5-inch hard disk drive 4 to fix the second positioning bracket 32 to the 2.5-inch hard disk drive 4.

The installation device in this embodiment adds an adapter bracket, eliminates the positioning buckle on the side of the bracket, and can be converted into a 2.5-inch hard disk drive bracket without making a new mold, which saves mold costs.

Embodiment 3

This embodiment provides a server. The server includes the installation device in embodiment 1 and/or the installation device and the hard disk drive fixed on the installation device in embodiment 2; the hard disk drives are arranged in an array. In this embodiment, the hard disk drive includes a 3.5-inch hard disk drive and a 2.5-inch hard disk drive.

In summary, the present disclosure provides an installation device and a server including the installation device. Compared with the traditional design, four screws are omitted to avoid manual locking operation in the production line and operation and maintenance of the hard disk drive module, which meets the requirements of easy installation and cost-saving design. In the installation operation, it only needs to put into the module, slide the module into place, and press the pressing buckle to complete the installation, which greatly saves installation time during mass production. And by adding an adapter bracket, it can be converted to a 2.5-inch hard drive bracket, which has strong compatibility. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

We claim:

1. An installation device, wherein the installation device is configured to install a hard disk drive, and the installation device comprises:
    a bottom bracket for supporting the hard disk drive;
    a first positioning bracket detachably arranged on a first side of the bottom bracket; and
    a second positioning bracket fixedly arranged on a second side opposite to the first side of the bottom bracket, the first positioning bracket and the second positioning bracket are configured to fix the hard disk drive,
    wherein a first positioning member is placed on the first positioning bracket, a second positioning member is placed on the second positioning bracket, and a third positioning member is placed on the first side of the bottom bracket,
    wherein a first side surface of the hard disk drive includes a first side hole, a second side surface opposite to the first side surface of the hard disk drive includes a second side hole, and a bottom side of the hard disk drive includes a third side hole, and
    wherein the hard disk drive comprises a first hard disk drive or a second hard disk drive, when the second hard disk drive is put into the bottom bracket, the third positioning member of the bottom bracket is buckled into the third side hole in a bottom side of the first positioning bracket, and the first fixing surface of the first positioning bracket is fixed to the first side surface of the hard disk drive by a bolt, to fix the first positioning bracket and the bottom bracket to the second hard drive.

2. The installation device according to claim 1, wherein the first positioning member corresponds to the first side hole on the first side surface of the hard disk drive; and the first side and a second side of the bottom bracket is parallel to an installation direction of the hard disk drive.

3. The installation device according to claim 2, wherein the first positioning member is placed on the first positioning bracket, the second positioning member is placed on the second positioning bracket, and the third positioning member is placed on the first side of the bottom bracket;
    the first side hole corresponds to the first positioning member, and the second side hole corresponds to the second positioning member;
    and the third side hole corresponds to the third positioning member.

4. The installation device according to claim 3, wherein the first positioning bracket comprises a first fixing surface and a second fixing surface, the first fixing surface is perpendicular to the second fixing surface, and the first positioning member is placed on the first fixing surface.

5. The installation device according to claim 4, wherein a size of the first hard disk drive is larger than a size of the second hard disk drive.

6. The installation device according to claim 1, wherein the first side of the bottom bracket includes a notch groove.

7. The installation device according to claim 6, wherein when the hard disk drive is the first hard disk drive and the first hard disk drive is put into the bottom bracket, the second positioning member is buckled into the second side hole of the first hard disk drive, and the third positioning member is buckled into the third side hole of the first hard disk drive to fix the second positioning bracket and the bottom bracket to the first hard drive.

8. The installation device according to claim 7, wherein a pressing buckle is installed at a position of the first positioning bracket corresponding to the notch groove; when the first hard disk drive is put into the bottom bracket, the pressing buckle of the first positioning bracket is slided into the notch groove, and the second fixing surface of the first positioning bracket is located at a lower part of the first side of the bottom bracket to fix the first positioning bracket to the first hard disk drive.

9. The installation device according to claim 8, wherein when the hard disk drive is the first hard disk drive, a length of the first positioning bracket is not greater than a length of the first side of the bottom bracket; a length of the second positioning bracket is not greater than a length of the second side of the bottom bracket; and the first side of the bottom bracket is parallel to the second side.

10. The installation device according to claim 4, wherein when the hard disk drive is the second hard disk drive and the second hard disk drive is put into the bottom bracket, the second positioning member is buckled into the second side hole of the second hard disk drive to fix the second positioning bracket to the second hard drive.

11. The installation device according to claim 10, wherein when the hard disk drive is the second hard disk drive, a length of the first positioning bracket is smaller than a length of the first side of the bottom bracket; a length of the second positioning bracket is not greater than a length of the second side of the bottom bracket.

12. The installation device according to claim 1, further comprising
    a rotary latch arranged on a bottom edge of the bottom bracket, and the rotary latch includes:
        a stop part integrally formed with the bottom bracket; and
        a rotation part rotatably connected with the stop part.

13. A server, comprising: an array of hard disk drives, for a hard disk drive selected from the array of hard disk drives, the hard disk drive includes an installation device with the hard disk drive fixed on the installation device, wherein the installation device includes:
    a bottom bracket for supporting the hard disk drive;
    a first positioning bracket detachably arranged on a first side of the bottom bracket; and
    a second positioning bracket fixedly arranged on a second side opposite to the first side of the bottom bracket, the first positioning bracket and the second positioning bracket are configured to fix the hard disk drive,
    wherein a first positioning member is placed on the first positioning bracket, a second positioning member is placed on the second positioning bracket, and a third positioning member is placed on the first side of the bottom bracket, wherein a first side surface of the hard disk drive includes a first side hole, a second side surface opposite to the first side surface of the hard disk drive includes a second side hole, and a bottom side of the hard disk drive includes a third side hole, and wherein the hard disk drive comprises a first hard disk drive or a second hard disk drive, when the second hard disk drive is put into the bottom bracket, the third positioning member of the bottom bracket is buckled into the third side hole in a bottom side of the first positioning bracket, and the first fixing surface of the first positioning bracket is fixed to the first side surface of the hard disk drive by a bolt, to fix the first positioning bracket and the bottom bracket to the second hard drive.

\* \* \* \* \*